(12) United States Patent
Ren et al.

(10) Patent No.: US 10,529,867 B1
(45) Date of Patent: Jan. 7, 2020

(54) SCHOTTKY DIODE HAVING DOUBLE P-TYPE EPITAXIAL LAYERS WITH HIGH BREAKDOWN VOLTAGE AND SURGE CURRENT CAPABILITY

(71) Applicants: Na Ren, Los Angeles, CA (US); Zheng Zuo, Los Angeles, CA (US); Ruigang Li, Los Angeles, CA (US)

(72) Inventors: Na Ren, Los Angeles, CA (US); Zheng Zuo, Los Angeles, CA (US); Ruigang Li, Los Angeles, CA (US)

(73) Assignee: AZ Power Inc., Culver City, CA (US)

( * ) Notice: Subject to any disclaimer, the term of this patent is extended or adjusted under 35 U.S.C. 154(b) by 0 days.

(21) Appl. No.: 16/177,943

(22) Filed: Nov. 1, 2018

(51) Int. Cl.
| | |
|---|---|
| *H01L 29/872* | (2006.01) |
| *H01L 29/16* | (2006.01) |
| *H01L 29/06* | (2006.01) |
| *H01L 29/66* | (2006.01) |
| *H01L 21/308* | (2006.01) |
| *H01L 21/02* | (2006.01) |

(52) U.S. Cl.
CPC ...... *H01L 29/872* (2013.01); *H01L 21/02529* (2013.01); *H01L 21/308* (2013.01); *H01L 29/0615* (2013.01); *H01L 29/1608* (2013.01); *H01L 29/6606* (2013.01); *H01L 21/02378* (2013.01)

(58) Field of Classification Search
CPC ........................ H01L 29/872; H01L 29/66143
See application file for complete search history.

(56) References Cited

U.S. PATENT DOCUMENTS

2009/0283776 A1* 11/2009 Iwamuro ............. H01L 29/7839
257/76

* cited by examiner

*Primary Examiner* — Thomas L Dickey
(74) *Attorney, Agent, or Firm* — Che-Yang Chen; Law Offices of Scott Warmuth

(57) ABSTRACT

In one aspect, a method for manufacturing a Schottky diode with double P-type epitaxial layers may include steps of: providing a substrate; forming a first epitaxial layer on top of the substrate; forming a second epitaxial layer on top of the first epitaxial layer; depositing a third epitaxial layer on top of the second epitaxial layer; patterning the second and third epitaxial layers to form a plurality of trenches in the second and third epitaxial layers; depositing a first ohmic contact metal on a backside of the substrate; forming a second ohmic contact metal on top of the patterned third epitaxial layer; forming a Schottky contact metal at a bottom portion of each trench; and forming a pad electrode on top of the Schottky contact metal. In one embodiment, the second and third epitaxial layers can be made by $P^-$ type SiC and $P^+$ type SiC, respectively.

14 Claims, 10 Drawing Sheets

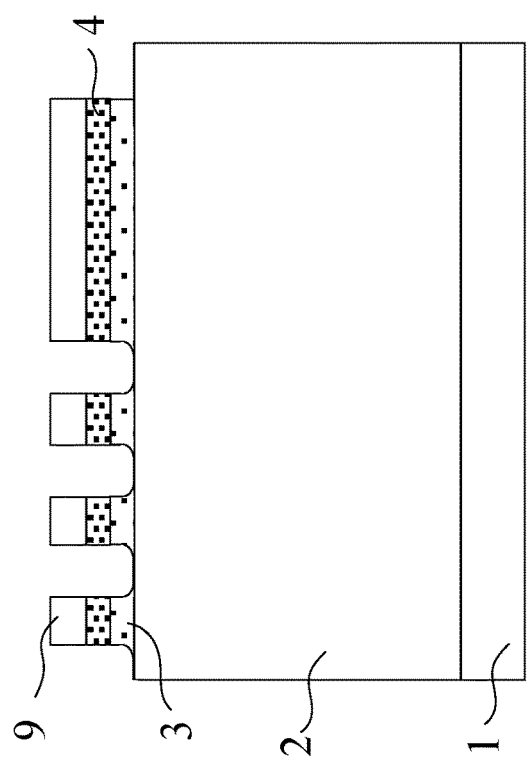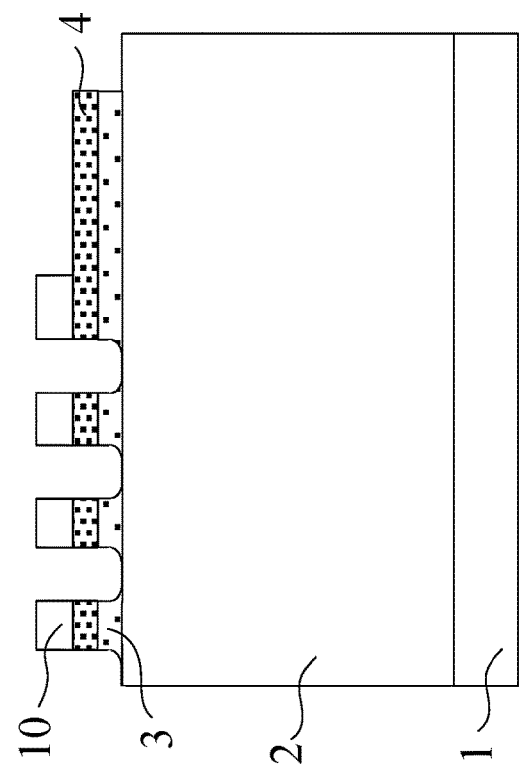

SCHOTTKY DIODE HAVING DOUBLE P-TYPE EPITAXIAL LAYERS WITH HIGH BREAKDOWN VOLTAGE AND SURGE CURRENT CAPABILITY

FIELD OF THE INVENTION

The present invention relates to a structure of a Scthottky diode with double P-type epitaxial layers, and the manufacturing method without implantation process.

BACKGROUND OF THE INVENTION

In recent years, in order to achieve high breakdown voltage, low loss, and the like in a semiconductor device, silicon carbide has begun to be adopted as a material for the semiconductor device. Silicon carbide has a wide energy bandgap, high melting point, low dielectric constant, high breakdown-field strength, high thermal conductivity, and high saturation electron drift velocity compared to silicon. These characteristics would allow silicon carbide power devices to operate at higher temperatures, higher power levels, and with lower specific on-resistance than conventional silicon based power devices. Such devices must also exhibit low reverse leakage currents. Large reverse leakage currents may cause premature soft breakdown.

FIG. 1 illustrates a cross sectional view of a conventional Schottky diode, which includes ohmic contact 6, substrate 1, an epitaxial layer 2, and Schottky contact metal 5. The Schottky contact metal is made of aluminum, titanium, nickel, silver or other metals. The substrate and epitaxial layers are usually doped with N-type impurity. A Schottky junction is formed between the Schottky contact metal and epitaxial layer.

The Silicon Carbide (SiC) Schottky diode is widely accepted in recent years as it features the benefits of Schottky barrier and wide band-gap material. As a majority carrier device, it has advantages of high voltage, high speed, and low forward voltage since there is no reverse recovery current.

For pure Schottky barrier diode, a big problem is that it's surge current capability is low when compared with PN junction diode. To address this problem, junction barrier Schottky (JBS) diode or merged PN junction Schottky (MPS) diode structures were proposed.

FIG. 2 illustrates a cross sectional view of a conventional JBS/MPS diode, which includes ohmic contact 6, substrate 1, epitaxial layer 2, Schottky contact metal 5 and P-type region 4, which is usually produced by ion implantation. Is this structure, the P-type region can form PN junction which can be activated in surge condition to gain surge current capability. In general, the JBS and MPS diodes use ion implantation process to introduce the impurity region. However, ion implantation damage exists in the high-concentration impurity region formed by the ion implantation. Furthermore, the device needs high temperature process which is not compatible with silicon process, and expensive production installations and production process are required.

Therefore, there remains a need for a new and improved fabrication technique to generate the JBS and MPS diodes without ion implantation process

SUMMARY OF THE INVENTION

In one aspect, a method for manufacturing a SiC Schottky diode with double P-type epitaxial layers may include the following steps: providing a substrate; forming a first epitaxial layer on top of the substrate; forming a second epitaxial layer on top of the first epitaxial layer; depositing a third epitaxial layer on top of the second epitaxial layer; patterning the second and third epitaxial layers to form a plurality of trenches in the second and third epitaxial layers; depositing a first ohmic contact metal on a backside of the substrate; forming a second ohmic contact metal on top of the patterned third epitaxial layer; forming a Schottky contact metal at a bottom portion of each trench; and forming a pad electrode on top of the Schottky contact metal.

In one embodiment, the substrate can be made by $N^+$ type silicon carbide (SiC), and the first epitaxial layer on top of the substrate can be made by $N^-$ type SiC. The second epitaxial layer on top of the first epitaxial layer can be made by $P^-$ type SiC, and the third epitaxial layer on top of the second epitaxial layer can be made by $P^+$ type SiC.

A first mask layer is formed in order to etch the second and third epitaxial layers to obtain a number of trenches in an active region and a JTE region in the end portion of the device. In one embodiment, to relieve the electric field concentration at the corner of the trench in reverse mode, smooth trench feature with rounded corner is preferred. Each trench has the third epitaxial layer on top of the second epitaxial layer, and the second epitaxial layer is located on top of the N-type SiC layer to form N-type Schottky junction. A second mask layer is formed in order to etch the third epitaxial layer on top of the JTE region away in the end portion.

Comparing with conventional manufacturing method, the present invention is advantageous because it is relatively simple and can reduce manufacturing cost by using double P-type epitaxially grown layers instead of ion implantation. Moreover, the JTE termination structure is formed by providing the P-type SiC epitaxial layer and the impurity concentration can be controlled. In the active region, by using smooth trench feature with rounded corner and P-type layer surrounded the corner, the leakage current is suppressed. As a result, the goal for a high breakdown voltage capability can be achieved in the present invention. More importantly, without ion implantation and activation annealing process, the semiconductor device in the present invention can be produced through low-temperature process, in which the ohmic contact annealing at 1000° C. or less, and the Schottky contact annealing at 600° C. or less can be performed similarly in the semiconductor manufacturing process, and the manufacturing cost of the semiconductor device can be significantly reduced.

BRIEF DESCRIPTION OF THE DRAWINGS

FIGS. 4A-4I illustrates a process flow for manufacturing the Schottky barrier diode with double P-type epitaxial layers in the present invention.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
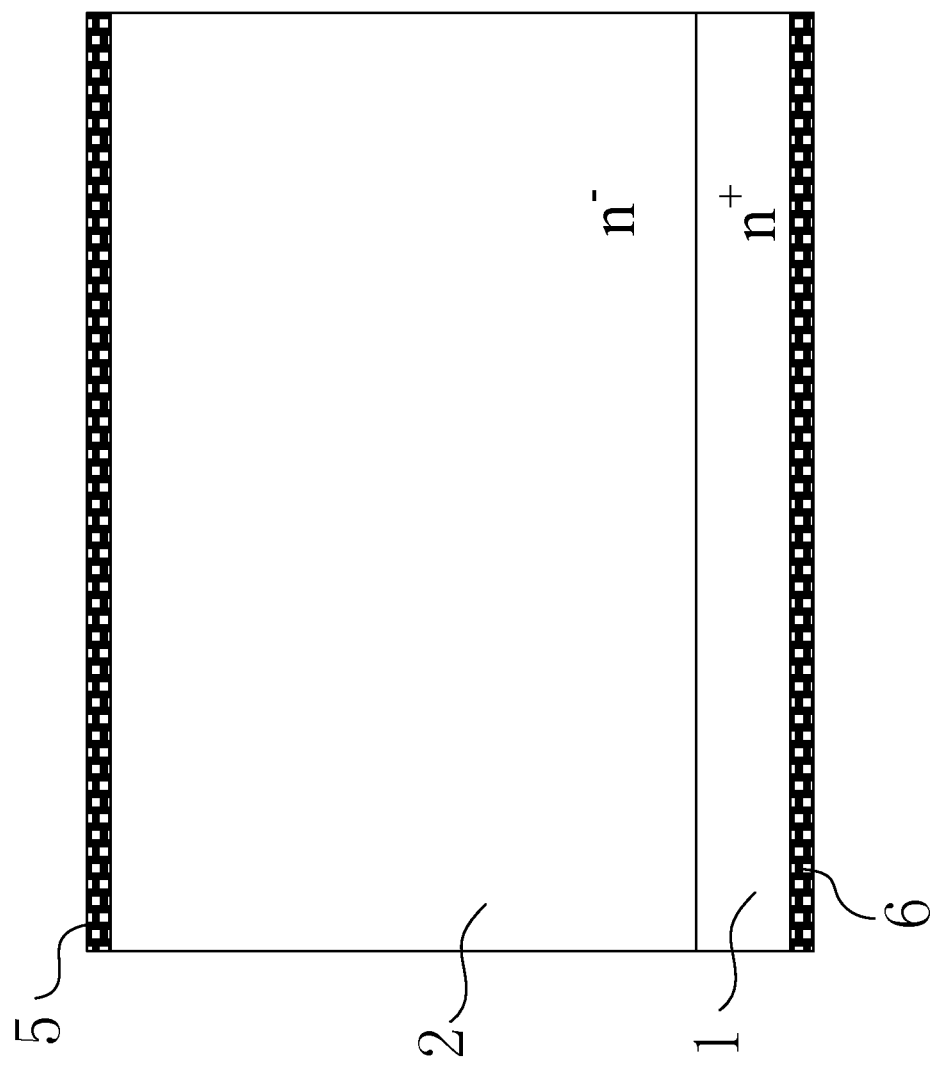
FIG. 1 is a cross-sectional view of a prior art disclosing a conventional Schottky diode.
Figure 2:
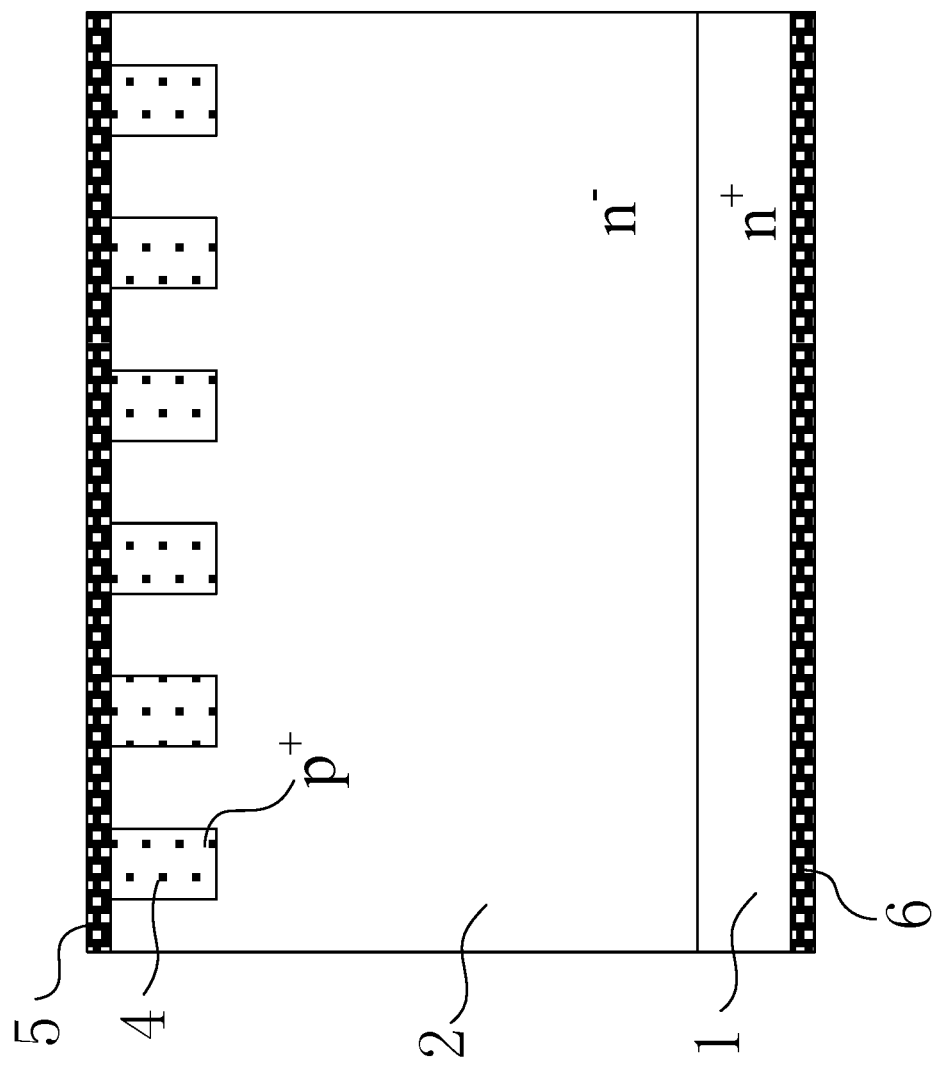
FIG. 2 is a cross-sectional view of a prior art disclosing a conventional merged PN junction Schottky barrier diode.
Figure 3:
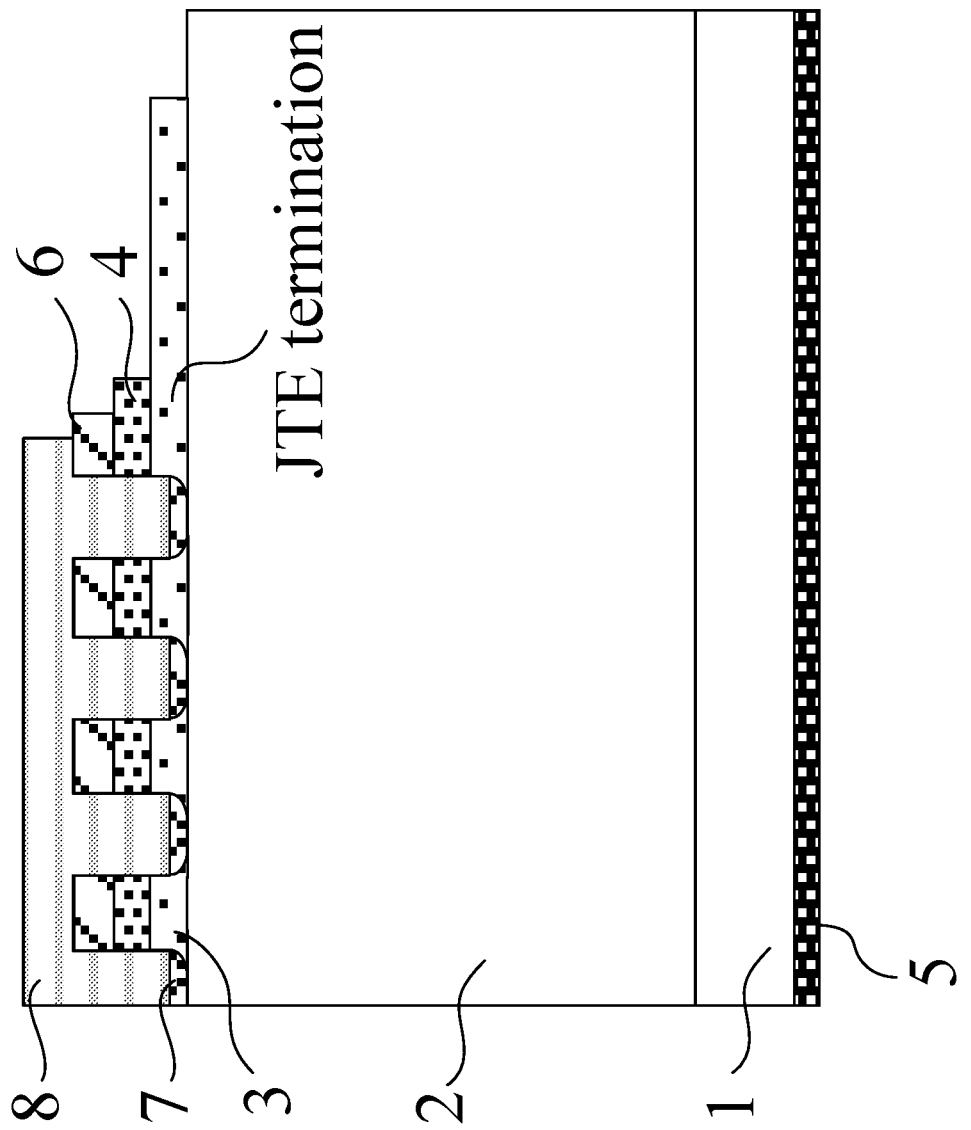
FIG. 3 illustrates a cross-sectional view of the Schottky barrier diode with double P-type epitaxial layers in the present invention.

FIG. 3 illustrates a cross sectional view of the SiC Schottky barrier diode without implantation process. The SiC Schottky diode in the present invention may include a first ohmic contact metal 5, an N$^+$ substrate 1, an N$^-$ epitaxial layer 2, a P$^-$ epitaxial layer 3, a P$^+$ epitaxial layer 4, a second ohmic contact metal 6, a Schottky contact metal 7, and a pad electrode 8.

In one embodiment, the material selected for the first ohmic contact metal 5 is nickel, silver or platinum. The substrate 1 produced from N$^+$ type SiC is located on the top of first ohmic contact metal 5, and the impurity concentration is about $10^{18}$~$10^{20}$ atoms/cm$^3$.

The epitaxial layer 2 produced from N-type SiC is located on the top of the substrate 1 and the thickness thereof is about 5 to 100 µm. It has an impurity concentration lower than that of the SiC substrate 1. For example, the impurity concentration of the epitaxial layer 2 is about $10^{15}$~$10^{17}$ atoms/cm$^3$.

The epitaxial layer 3 produced from P$^-$ type SiC is located on the top of the epitaxial layer 2. The thickness of the epitaxial layer 3 is about 0.1~2 µm, and the impurity concentration is about $10^{16}$~$10^{18}$ atoms/cm$^3$. The epitaxial layer 4 produced from P$^+$ type SiC is located on the top of the epitaxial layer 3, and the thickness of the epitaxial layer 4 is about 0.1~5 µm, and the impurity concentration is about $10^{18}$~$10^{21}$ atoms/cm$^3$.

A trench with rounded corner is formed in the P+ type epitaxial layer 4 and P$^-$ type epitaxial layer 3, and the corner portion in which a side face and a bottom surface of the recess intersect each other is located in the P$^-$ type SiC layer 3. The center part of the trench ends in the surface of the N$^-$ type epitaxial layer 2, which means the N$^-$ type SiC layer 2 can be exposed in the middle portion of the trench bottom.

A second ohmic contact electrode 6 is provided while being in contact with the upper surface of the P+ type SiC epitaxial layer 4. The P+ type SiC epitaxial layer 4 is in ohmic contact with the second ohmic contact electrode 6. In one embodiment, the second ohmic contact electrode 6 can be made by nickel, aluminum, titanium, etc.

A Schottky contact metal 7 is provided at the bottom surface of the trench to form a Schottky junction between the Schottky contact metal 7 and the exposed N$^-$ type SiC epitaxial layer 2. In one embodiment, the Schottky contact metal can be made by titanium, nickel, aluminum, silver, tungsten, etc.

A pad electrode 8 that constitutes an anode electrode is formed on the Schottky contact metal 7. For example, the thickness of the pad electrode 8 may be 3~6 µm, and the material of the pad electrode 8 can be aluminum if aluminum wire bonding is performed.

An end portion of the Schottky diode is formed into a junction termination extension (JTE) structure, in which, the upper P+ type epitaxial layer 4 is etched away and part of P$^-$ type epitaxial layer 3 is remained as the JTE region. It is noted that the impurity concentration and the width of the remained P$^-$ type epitaxial layer 3 in the end portion is optimized to achieve high breakdown voltage, and the blocking efficiency is very sensitive to the impurity concentration of the JTE region. By using the epitaxially grown P-type layers, the present invention has an advantage of high accuracy and controllability of the impurity concentration, which is difficult to control during ion implantation.

In a forward mode, the Schottky contact between the Schottky contact electrode 7 and N$^-$ type epitaxial layer 2 at the trench bottom is firstly turned on. With an increasing voltage, the PN junction between the P$^+$/P$^-$ epitaxial layer and N$^-$ epitaxial layer 2 will be activated since the first electrode 6 and the P$^+$ epitaxial layer is in ohmic contact. The mesa width of the double P-type epitaxial layer (P$^+$ epitaxial layer 3 and P$^-$ epitaxial layer 4) and the space between adjacent mesas are predetermined to activate the PN junction early, and holes can then be injected from the P$^+$ epitaxial layer 4 to N$^-$ drift layer 2. Therefore, a conductivity modulation can be achieved with surge current capability. By using epitaxially grown P$^+$ type SiC layer and P$^-$ type SiC layer, the present invention is advantageous because of its high injection efficiency since there is no damage to shorten the life of the carrier and to cause injection efficiency degradation, which is currently the concerns for ion implantation-based structure.

A method for manufacturing a SiC Schottky diode with double P-type epitaxial layers may include the following steps: providing a substrate 510; forming a first epitaxial layer on top of the substrate 520; forming a second epitaxial layer on top of the first epitaxial layer 530; depositing a third epitaxial layer on top of the second epitaxial layer 540; patterning the second and third epitaxial layers to form a plurality of trenches in the second and third epitaxial layers 550; depositing a first ohmic contact metal on a backside of the substrate 560; forming a second ohmic contact metal on top of the patterned third epitaxial layer 570; forming a Schottky contact metal at a bottom portion of each trench 580; and forming a pad electrode on top of the Schottky contact metal 590. FIGS. 4A-4H illustrate a process flow for manufacturing the SiC Schottky diode with double P-type epitaxial layers in the present invention.

Figure 4A:
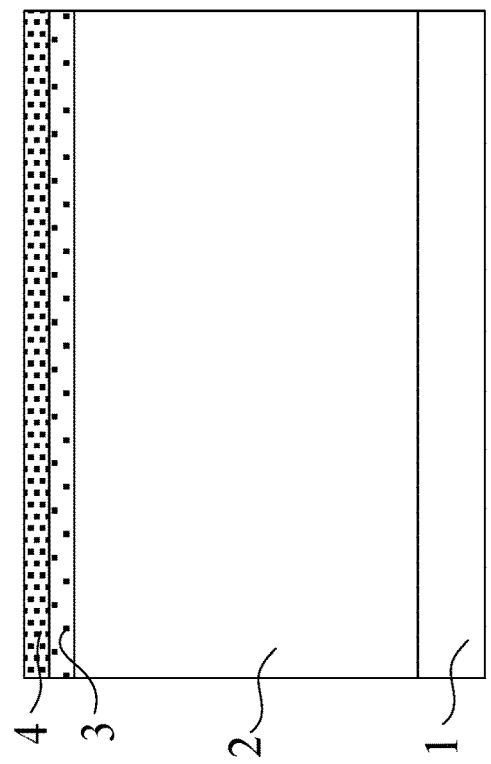

In one embodiment, as shown in FIG. 4A, the substrate in step 510 can be made by $N^+$ type silicon carbide (SiC), and the first epitaxial layer on top of the substrate in step 520 can be made by $N^-$ type SiC. The second epitaxial layer on top of the first epitaxial layer in step 530 can be made by $P^-$ type SiC, and the third epitaxial layer on top of the second epitaxial layer in step 540 can be made by $P^+$ type SiC.

Figure 4B:
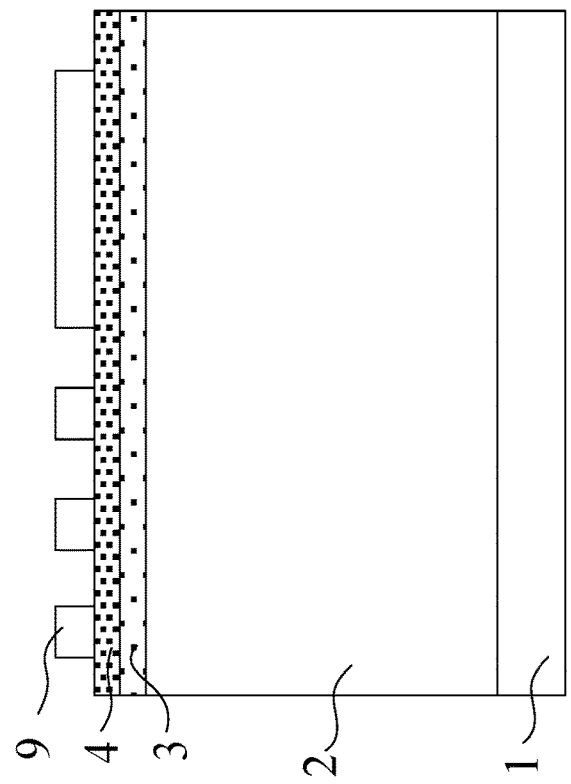
Figure 4E:
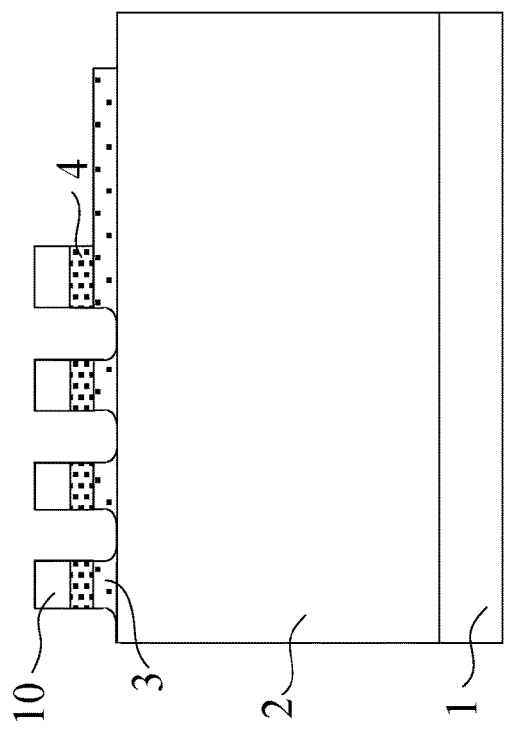

As shown in FIGS. 4B and 4C, a first mask layer 9 is formed in order to etch the $P^+$ epitaxial layer 4 and $P^-$ epitaxial layer 3 to obtain a number of trenches in an active region and a JTE region in the end portion of the device. In one embodiment, to relieve the electric field concentration at the corner of the trench in reverse mode, smooth trench feature with rounded corner is preferred. Each trench has the $P^+$ epitaxial layer 4 on top of the $P^-$ epitaxial layer 3, and the $P^-$ epitaxial layer 3 is located on the N-type SiC layer 2 to form N-type Schottky junction. As shown in FIGS. 4D and 4E, a second mask layer 10 is formed in order to etch the $P^+$ epitaxial layer on top of the JTE region away in the end portion.

Figure 4F:
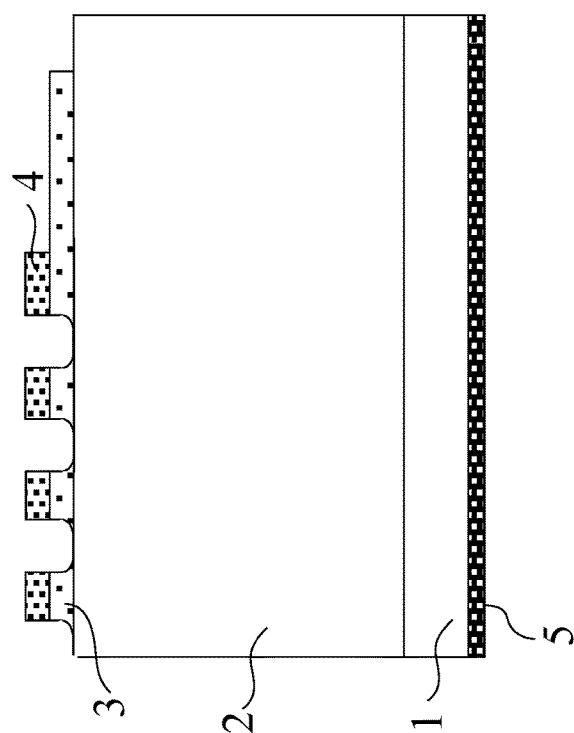
Figure 4G:
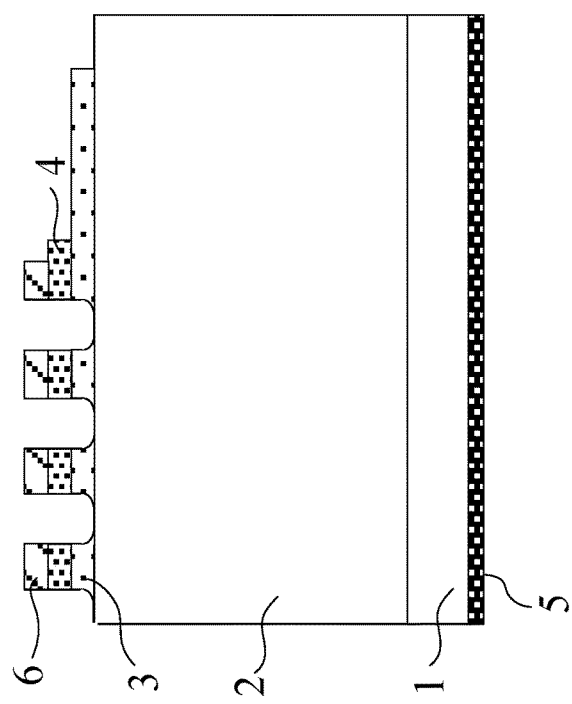

FIG. 4F shows the step 560 of depositing a first ohmic contact metal 5 on a backside of the substrate 1, and FIG. 4G shows the step 570 of forming a second ohmic contact metal 6 on top of the patterned third epitaxial layer 4.

Figure 4H:
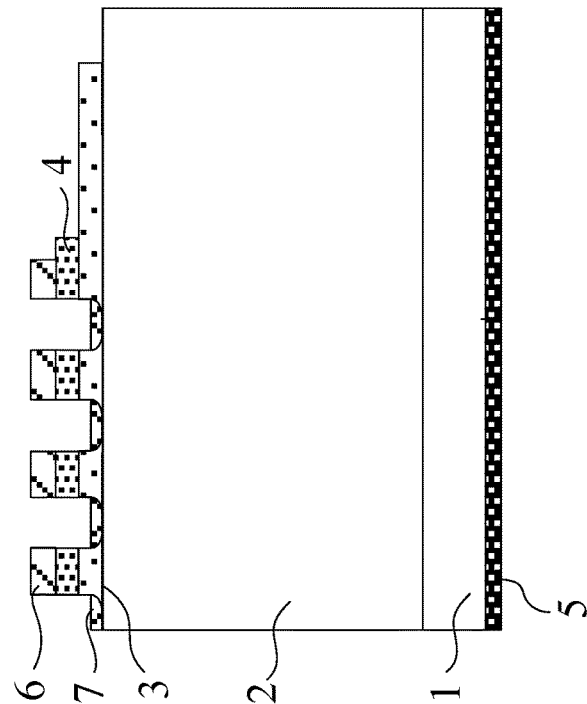

FIG. 4H shows the step of forming a Schottky contact metal at a bottom portion of each trench 580, namely depositing a Schottky contact metal on the top of the $N^-$ type epitaxial layer 2 to form a Schottky junction between the Schottky contact metal and the $N^-$ type epitaxial layer 2.

Figure 4I:
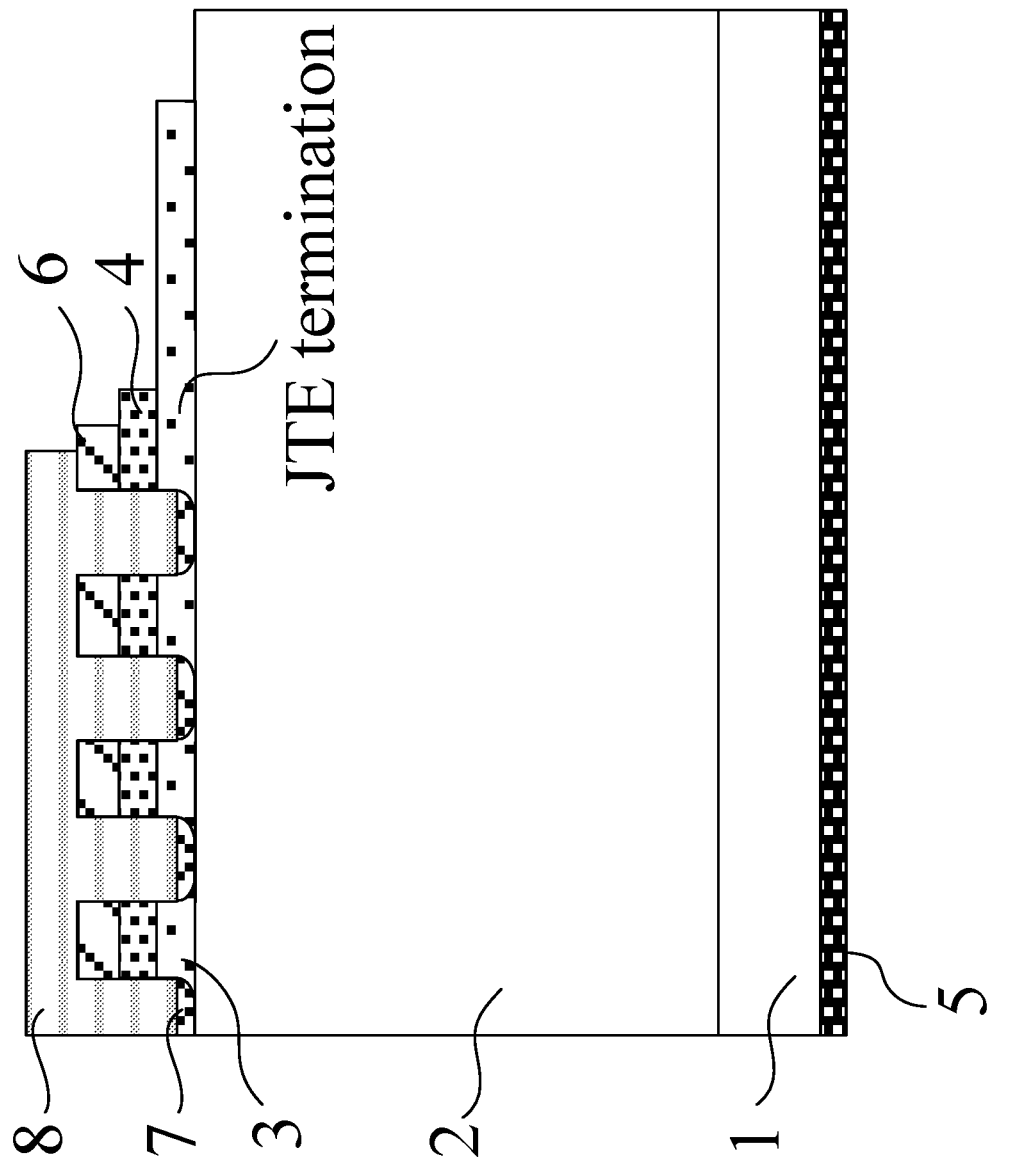
Figure 5:
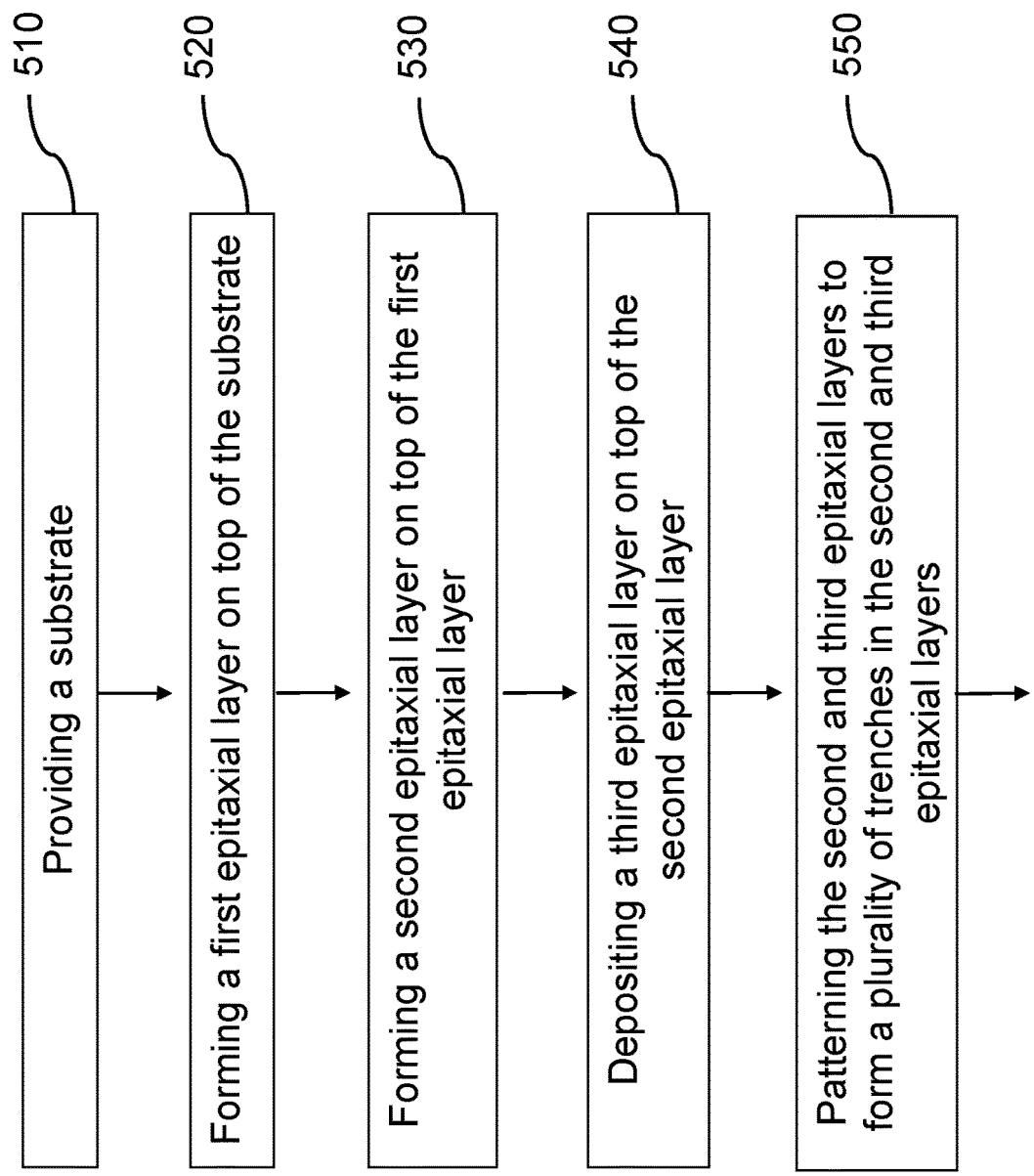
FIG. 5 illustrates a method for manufacturing the Schottky barrier diode with double P-type epitaxial layers in the present invention.
Figure 5:
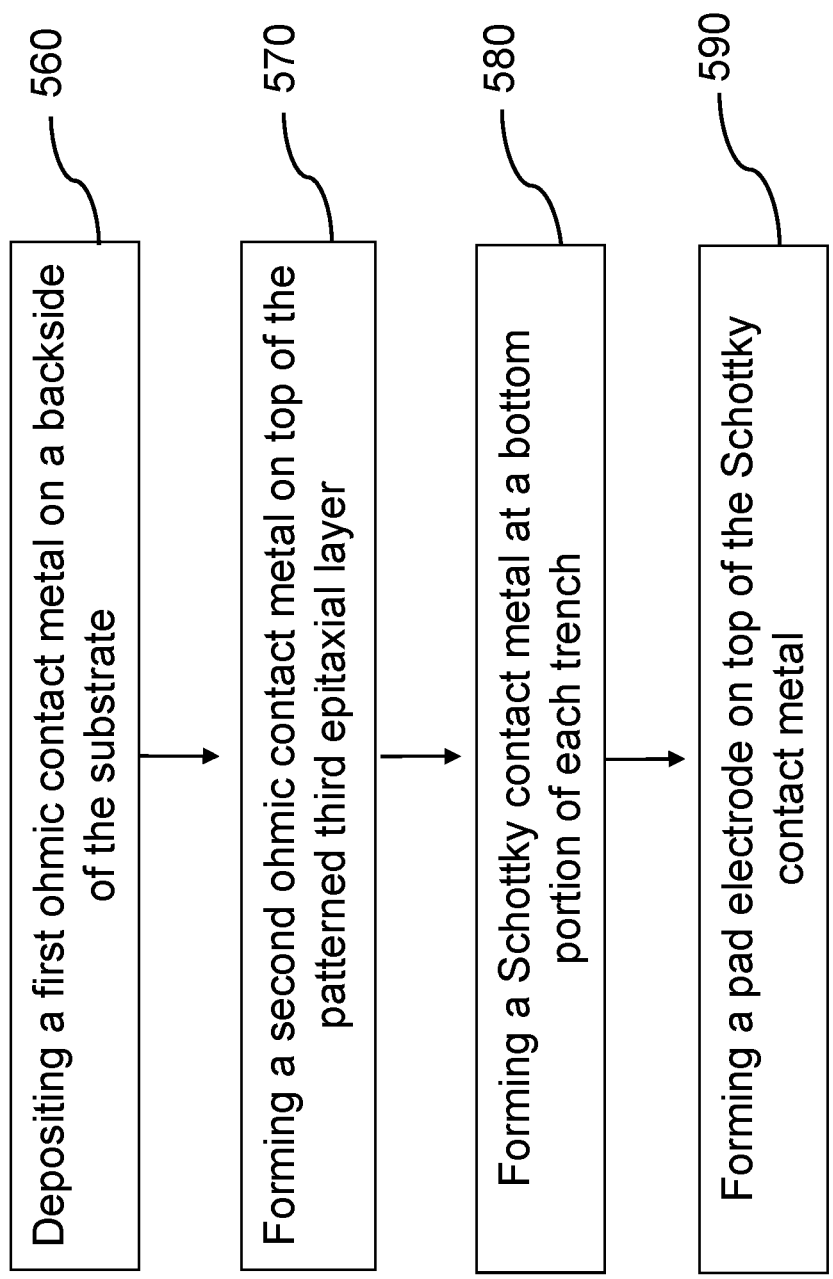

FIG. 4I shows the final step for manufacturing a SiC Schottky diode with double P-type epitaxial layers in the present invention, which is the step of forming a pad electrode on top of the Schottky contact metal 7, namely providing a thick electrode metal on the top of the Schottky contact metal 7. In one embodiment, the electrode metal can be aluminum.

Comparing with conventional manufacturing method, the present invention is advantageous because it is relatively simple and can reduce manufacturing cost by using double P-type epitaxially grown layers instead of ion implantation. Moreover, the JTE termination structure is formed by providing the $P^-$ type SiC epitaxial layer and the impurity concentration can be controlled. In the active region, by using smooth trench feature with rounded corner and $P^-$ type layer surrounded the corner, the leakage current is suppressed. As a result, the goal for a high breakdown voltage capability can be achieved in the present invention. More importantly, without ion implantation and activation annealing process, the semiconductor device in the present invention can be produced through low-temperature process, in which the ohmic contact annealing at 1000° C. or less, and the Schottky contact annealing at 600° C. or less can be performed similarly in the semiconductor manufacturing process, and the manufacturing cost of the semiconductor device can be significantly reduced.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method for manufacturing a Silicon Carbide (SiC) Schottky diode with double P-type epitaxial layers comprising steps of:
   providing a substrate;
   forming a first epitaxial layer on top of the substrate;
   forming a second epitaxial layer on top of the first epitaxial layer;
   depositing a third epitaxial layer on top of the second epitaxial layer;
   patterning the second and third epitaxial layers to form a plurality of trenches in the second and third epitaxial layers;
   depositing a first ohmic contact metal on a backside of the substrate;
   forming a second ohmic contact metal on top of the patterned third epitaxial layer;
   forming a Schottky contact metal at a bottom portion of each trench;
   forming a pad electrode on top of the Schottky contact metal; and
   forming a junction termination extension (JTE) structure at an end portion of the Schottky diode, in which the third epitaxial layer is etched away and a portion of the second epitaxial layer is remained.

2. The method for manufacturing a Silicon Carbide (SiC) Schottky diode with double P-type epitaxial layers of claim 1, wherein the substrate is made by $N^+$ type SiC, and the first epitaxial layer on top of the substrate is made by $N^-$ type SiC.

3. The method for manufacturing a Silicon Carbide (SiC) Schottky diode with double P-type epitaxial layers of claim 1, wherein the second epitaxial layer on top of the first epitaxial layer is made by $P^-$ type SiC, and the third epitaxial layer on top of the second epitaxial layer is made by $P^+$ type SiC.

4. The method for manufacturing a Silicon Carbide (SiC) Schottky diode with double P-type epitaxial layers of claim 1, wherein the step of patterning the second and third epitaxial layers to form a plurality of trenches in the second and third epitaxial layers includes a step of providing and patterning a first mask layer to etch the $P^+$ epitaxial layer and $P^-$ epitaxial layer to obtain the trenches.

5. The method for manufacturing a Silicon Carbide (SiC) Schottky diode with double P-type epitaxial layers of claim 1, wherein the first ohmic contact metal is selected from nickel, silver or platinum.

6. The method for manufacturing a Silicon Carbide (SiC) Schottky diode with double P-type epitaxial layers of claim 1, wherein the second ohmic contact metal is selected from nickel, aluminum or titanium.

7. The method for manufacturing a Silicon Carbide (SiC) Schottky diode with double P-type epitaxial layers of claim 1, wherein the Schottky contact metal is selected from titanium, nickel, aluminum, silver or tungsten.

8. A Silicon Carbide (SiC) Schottky diode with double P-type epitaxial layers comprising:
   a SiC substrate;
   a first ohmic contact metal underneath the SiC substrate;
   a first epitaxial layer on top of said substrate;
   a second epitaxial layer on top of said first epitaxial layer;
   a third epitaxial layer on top of said second epitaxial layer;
   a plurality of trenches formed by patterning and etching said second and third epitaxial layers;
   a second ohmic contact metal formed on the top of said third epitaxial layer;

a Schottky contact metal deposited at a bottom portion of each trench on the first epitaxial layer to form a Schottky junction between said Schottky contact metal and said first epitaxial layer;

a pad electrode filled into said trenches and located on top of said Schottky contact metal; and a junction termination extension (JTE) structure at an end portion of the Schottky diode, in which the third epitaxial layer is etched away and a portion of the second epitaxial layer is remained.

9. The Silicon Carbide (SiC) Schottky diode with double P-type epitaxial layers of claim 8, wherein the substrate is made by $N^+$ type SiC, and the first epitaxial layer on top of the substrate is made by $N^-$ type SiC.

10. The Silicon Carbide (SiC) Schottky diode with double P-type epitaxial layers of claim 8, wherein the second epitaxial layer on top of the first epitaxial layer is made by $P^-$ type SiC, and the third epitaxial layer on top of the second epitaxial layer is made by $P^+$ type SiC.

11. The Silicon Carbide (SiC) Schottky diode with double P-type epitaxial layers of claim 8, wherein a bottom portion of each trench has a round corner.

12. The Silicon Carbide (SiC) Schottky diode with double P-type epitaxial layers of claim 8, wherein the thickness of said first epitaxial layer is about 5~100 μm.

13. The Silicon Carbide (SiC) Schottky diode with double P-type epitaxial layers of claim 8, wherein the thickness of said second epitaxial layer is about 0.1~2 μm.

14. The Silicon Carbide (SiC) Schottky diode with double P-type epitaxial layers of claim 8, wherein the thickness of said third epitaxial layer is about 0.1~5 μm.

* * * * *